US012613284B2

(12) United States Patent (10) Patent No.: US 12,613,284 B2
Negoita et al. (45) Date of Patent: Apr. 28, 2026

(54) BATTERY MANAGEMENT SYSTEM FOR DETERMINING A HEALTH OF A POWER SOURCE BASED ON AN IMPEDANCE INDICATOR

(71) Applicants: VOLKSWAGEN AKTIENGESELLSCHAFT, Wolfsburg (DE); The Board of Trustees of the Leland Stanford Junior University, Stanford, CA (US)

(72) Inventors: Gianina Alina Negoita, San Leandro, CA (US); William Arthur Paxton, Redwood City, CA (US); Anirudh Allam, Stanford, CA (US); Simona Onori, Palo Alto, CA (US); Gabriele Pozzato, Palo Alto, CA (US); Luca Pulvirenti, Redwood City, CA (US)

(73) Assignees: VOLKSWAGEN AKTIENGESELLSCHAFT, Wolfsburg (DE); THE BOARD OF TRUSTEES OF THE LELAND STANFORD JUNIOR UNIVERSITY, Stanford, CA (US)

( * ) Notice: Subject to any disclaimer, the term of this patent is extended or adjusted under 35 U.S.C. 154(b) by 792 days.

(21) Appl. No.: 17/940,946

(22) Filed: Sep. 8, 2022

(65) Prior Publication Data

US 2024/0085487 A1 Mar. 14, 2024

(51) Int. Cl.
*G01R 31/392* (2019.01)
*G01R 31/3842* (2019.01)
*G01R 31/389* (2019.01)

(52) U.S. Cl.
CPC ....... *G01R 31/392* (2019.01); *G01R 31/3842* (2019.01); *G01R 31/389* (2019.01)

(58) Field of Classification Search
CPC G01R 31/392; G01R 31/3842; G01R 31/389; H01M 10/44
USPC .......................................................... 320/132
See application file for complete search history.

(56) References Cited

U.S. PATENT DOCUMENTS

| | | | |
|---|---|---|---|
| 2011/0181246 A1* | 7/2011 | Tae ....................... | H02J 7/0014 |
| | | | 320/118 |
| 2012/0200266 A1* | 8/2012 | Berkowitz ............ | H01M 10/44 |
| | | | 320/139 |
| 2016/0200216 A1* | 7/2016 | Fultz ...................... | B60L 58/21 |
| | | | 320/136 |
| 2017/0256825 A1* | 9/2017 | Sun ....................... | H02J 7/0029 |
| 2018/0364311 A1* | 12/2018 | De Breucker ....... | G01R 31/396 |
| 2019/0013681 A1* | 1/2019 | De Breucker ....... | H02J 7/0024 |
| 2019/0094942 A1* | 3/2019 | Matsumura ........... | G06F 1/3212 |
| 2019/0245252 A1* | 8/2019 | Mäki ................... | H01M 10/482 |
| 2019/0288520 A1* | 9/2019 | Abdel-Monem .... | G01R 31/392 |
| 2020/0110135 A1* | 4/2020 | Zeier ................... | H02J 7/00711 |
| 2021/0351446 A1* | 11/2021 | Zhu ....................... | H02J 7/0047 |
| 2022/0373600 A1* | 11/2022 | Leonard .................. | G06N 3/09 |

* cited by examiner

*Primary Examiner* — Huy Q Phan

(57) ABSTRACT

A method is provided. The method includes determining an open circuit voltage of a battery of a vehicle. The method also includes determining a voltage of a current provided to the battery of the vehicle. The method further includes determining a impedance indicator based on the voltage, the open circuit voltage, and the current provided to the battery of the vehicle. The method further includes determining a health of the battery based on the impedance indicator.

20 Claims, 5 Drawing Sheets

400

BATTERY MANAGEMENT SYSTEM FOR DETERMINING A HEALTH OF A POWER SOURCE BASED ON AN IMPEDANCE INDICATOR

TECHNICAL FIELD

Aspects of the present disclosure relate to a battery management system for determining the health of a power source (e.g., a battery), and more particularly, to a battery management system for determining the health of the power source based on a impedance indicator.

BACKGROUND

Various devices (e.g., smart phones, computing devices, laptop computers, tablet computers, etc.) and apparatuses (e.g., vehicles) may use a power source to operate. For example, a vehicle may use a battery, fuel, a fuel cell, or some other power source to power the components of the vehicle and/or to move the vehicle. As the battery is discharged (to provide power to the vehicle) and charged, the battery may age. As the battery ages, the performance of the battery may degrade. For example, the battery may require more voltage/current to charge, the capacity (e.g., the power/ storage capacity) of the battery may decrease, and/or the amount of power provided by the battery may decrease.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

As discussed above, when a power source, such as a battery, is discharged (to provide power to a device/apparatus, such as a vehicle) and charged, the battery may age. As the battery ages, the battery may require more voltage/ current to charge, the capacity (e.g., the power capacity) of the battery may decrease, and/or the amount of power provided by the battery may decrease. The health of the battery (e.g., a state of health) may be an indicator to quantify an aging level for a battery in terms of changes in capacity (e.g., a decrease in capacity) and/or changes in internal resistance (e.g., increase in resistance). Determining the health of the battery may be useful and/or important for improving battery life, understanding battery operation, and gaining increased performance from the battery.

While the health of a battery may be measured with sufficient accuracy from lab tests, it is difficult to determine the health of a battery while the battery is in use (e.g., while vehicle is using the battery). For example, it may be difficult to determine the health of the battery while the battery is being charged and/or discharged (e.g., when power from the battery is used to drive a vehicle, power electronics, etc.). Because it is difficult to determine the health of the battery while the battery is in use (e.g., Is charging/discharging), it may be difficult to determine the health of the battery and/or changes to the health of the battery that occur while the battery is in use (e.g., while the battery is charging).

The examples, implementations, and/or embodiments described herein may be used to determine the health of a power source, such as a battery, and/or changes to the health of the power source (e.g., a decrease in health) while the power source is in use. Some of the embodiments described herein use a current provided to the battery and voltages, such as the voltage of the current and an open circuit voltage, to determine an impedance indicator. These voltages may be measured and/or determined while the battery is in operation, which allows for a battery management system to determine/calculate the impedance indicators while the battery is in operation (e.g., while the battery is charging). The impedance indicators may indicate a resistance and/or an impedance of the battery, which may allow the battery management system to determine the health of the battery more accurately. In addition, measuring the voltages and/or currents may be performed quickly and easily, which allows the battery management system to determine the health of the battery more quickly and/or efficiently.

Although the present disclosure may refer to batteries and vehicles, the examples, implementations, aspects, and/or embodiments described herein may be used with various types of power sources for various types of devices/apparatuses.

Figure 1:
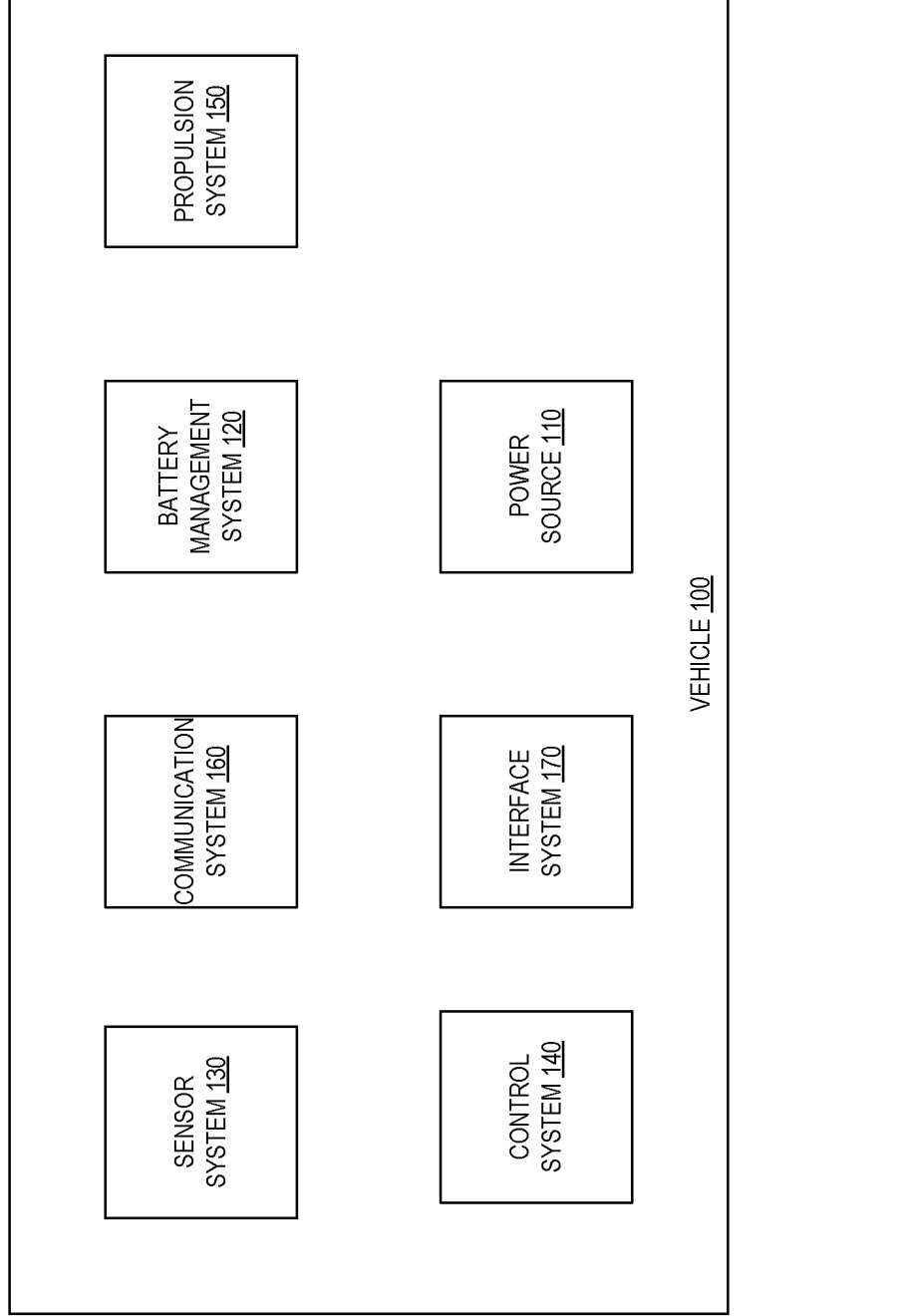
FIG. 1 is a block diagram that illustrates an example vehicle, in accordance with one or more embodiments of the present disclosure.

FIG. 1 is a block diagram that illustrates an example vehicle 100, in accordance with one or more embodiments of the present disclosure. In one embodiment, the vehicle 100 may be an autonomous vehicle (e.g., a self-driving vehicle). For example, the vehicle 100 may be a vehicle (e.g., car, truck, van, mini-van, semi-truck, taxi, drone, etc.) that may be capable of operating autonomously or semi-autonomously. In another embodiment, the vehicle 100 may also be a vehicle with autonomous capabilities. A vehicle with autonomous capabilities may be a vehicle that may be capable of performing some operations, actions, functions, etc., autonomously. For example, vehicle 100 may have adaptive cruise control capabilities and/or lane assist/keep capabilities. A vehicle 100 with autonomous capabilities may be referred to as a semi-autonomous vehicle.

The vehicle 100 may include various systems that allow the vehicle 100 to operate specific functions. For example, vehicle 100 includes a sensor system 130, a control system 140, a communication system 160, an interface system 170, a propulsion system 150, a power source 110, and a battery management system 120. In other embodiments, the vehicle 100 may include more, fewer, and/or different systems, and each system may include more, fewer, and/or different components. Additionally, the systems and/or components may be combined and/or divided in any number/possibility of arrangements.

The sensor system 130 may include one or more sensors (e.g., detectors, sensing elements, sensor devices, etc.). The one or more sensors may provide information about the operation of the vehicle 100, information about the condition of the vehicle 100, information about occupants/users of the vehicle 100, and/or information about the environment (e.g., a geographical area) where the vehicle 100 is located. The one or more sensors may be coupled to various types of communication interfaces (e.g., wired interfaces, wireless interfaces, etc.) to provide sensor data to other systems of the vehicle 100. For example, a sensor may be coupled to a storage device (e.g., a memory, a cache, a buffer, a disk drive, flash memory, etc.) and/or a computing device (e.g., a processor, an ASIC, an FPGA, etc.) via a control area network (CAN) bus (or other type of communication bus, such as a Flexray). In another example, a sensor may be coupled to a storage drive and/or a computing device via Bluetooth, Wi-Fi, etc. Examples of sensors may include, but are not limited to, tire pressure sensors, steering sensors (e.g., to determine the positions/angles of one or more wheels), a compass, temperature sensors, a global positioning system (GPS) receiver/sensor, a light detection and ranging (LIDAR) device/sensor, an ultrasonic device/sensor, a camera (e.g., a video camera), a radar device/sensor, etc.

The control system 140 may include hardware, software, firmware, or a combination thereof that may control the functions, operations, actions, etc., of the vehicle 100. For example, the control system 140 may be able to control a braking system and/or an engine to control the speed and/or acceleration of the vehicle 100. In another example, the control system 140 may be able to control a steering system to turn the vehicle 100 left or right. In a further example, the control system 140 may be able to control the headlights or an all-wheel drive (AWD) system of the vehicle 100 based on weather/driving conditions (e.g., if the environment has snow/rain, if it is nighttime in the environment, etc.). The control system 140 may use sensor data and/or outputs generated by machine learning models to control the vehicle 100.

The control system 140 may use outputs generated one or more machine learning models to control the vehicle. For example, control system 140 may generate one or more steering commands based on the outputs of a machine learning model (e.g., based on objects detected by a machine learning model). The steering command may indicate the direction that a vehicle 100 should be turned (e.g., left, right, etc.) and may indicate the angle of the turn. The control system 140 may actuate one or more mechanisms/systems (e.g., a steering system, a steering wheel, etc.) to turn the vehicle 100 (e.g., to control the vehicle 100) based on the steering command. For example, the control system 140 may actuate one or more steering mechanisms that may turn/move the wheels of the vehicle by a certain number of degrees to steer the vehicle 100. The control system 140 may also control acceleration and/or deceleration of the vehicle 100. For example, the control system 140 may use the accelerator to speed up the vehicle 100 or may use the brake to slow down the vehicle 100.

The communication system 160 may include various devices, systems, components, software, hardware, firmware, etc., that allow the vehicle 100 to communicate (e.g., transmit and/or receive data) with various networks (e.g., computer networks, communication networks, etc.) and/or devices (e.g., other vehicles, server computers, etc.). For example, the communication system 160 may include antennas, network interfaces, wireless network interfaces (e.g., cellular, Wi-Fi, Bluetooth, ZigBee, ZWave, and/or other network interfaces). The communication system 160 may also allow the vehicle 100 to communicate with other vehicles (e.g., V2V communications), with infrastructure (e.g., V2I communications), and/or with other devices/networks (e.g., V2X communications).

The interface system 170 may include various devices, systems, components, software, hardware, firmware, etc., that allow the vehicle 100 to interact with external sensors, other vehicles, external computing devices, and/or a user. For example, the interface system 170 may include buttons, knobs, dials, touch screens, microphones, cameras, and/or other devices that interact with a user, present information to a user, receive user input from a user, etc. The interface system 170 may be used to display and/or indicate a health (e.g., a state of health, SoH, etc.) of the power source 110, as discussed in more detail below.

The propulsion system 150 may include various devices, systems, components, software, hardware, firmware, etc., that may be used to move the vehicle 100. For example, the propulsion system 150 may include an engine/motor, an energy source, a transmission, and wheels/tires. The engine/motor may include any combination of an internal combustion engine, an electric motor (that can be powered by an electrical battery, fuel cell, and/or other energy storage device), and/or a steam engine.

The power source 110 may be a source of energy that provides power (e.g., energy, electricity, etc.) to various components, modules, and/or systems of the vehicle 100. For example, the power source 110 may be used to power one or more of the sensor system 130, control system 140, communication system 160, interface system 170, propulsion system 150. Examples of power sources (e.g., energy sources) may include gasoline, diesel, propane, other compressed gas-based fuels, ethanol, solar panels, batteries, and other sources of electrical power. The power source 100 may be a combination of multiple power sources (e.g., may include any combination of fuel tanks, batteries, capacitors, and/or flywheels). In one embodiment, the power source 110 may be a battery (e.g., a lithium-ion battery, an electrical battery, etc.).

The battery management system (BMS) 120 may include various devices, systems, components, software, hardware, firmware, etc., that may the various characteristics of the power source 110. For example, if the power source 110 is a battery, the BMS 120 may monitor characteristics (e.g., operating parameters, conditions, etc.) such as battery temperature, battery voltage, battery current, battery charging and discharging data, etc. The characteristics can be stored locally in the vehicle 100 by the BMS 120. The BMS 120 can also transmit such monitored information via the communications system 160 to other devices (e.g., to a server computer, to a cloud, etc.). The BMS 120 may also regulate the operating conditions of the power source 110. For example, the BMS 120 may cool the battery temperature to within a predefined threshold temperature.

Although not illustrated in FIG. 1, the vehicle 100 may also include various computing resources and/or devices. For example, the vehicle 100 may include hardware such as processing devices (e.g., processors, central processing units (CPUs), processing cores, graphics processing units (GPUS)), memory (e.g., random access memory (RAM), storage devices (e.g., hard-disk drive (HDD), solid-state drive (SSD), etc.), and other hardware devices (e.g., sound card, video card, etc.). The vehicle 100 may also include computing devices. The computing devices may comprise any suitable type of computing device or machine that has a programmable processor including, for example, a computer. In some examples, the computing devices may include a single machine or may include multiple interconnected machines (e.g., multiple computers configured in a cluster).

As discussed in more detail below, the battery management system 120 may use a current provided to the battery and voltages, such as the voltage of the current and an open circuit voltage, to determine a impedance indicator (e.g., a pseudo-resistance). The battery management system 120 may determine the voltages and/or the current while the power source is in operation (e.g., while a battery is charging) using sensors coupled to one or more terminals of the power source. The impedance indicators may indicate resistances and/or impedances of the battery at difference states of charge, which may allow the battery management system to determine the health of the battery and/or changes to the health of the battery more accurately, quickly, and/or efficiently.

Figure 2:
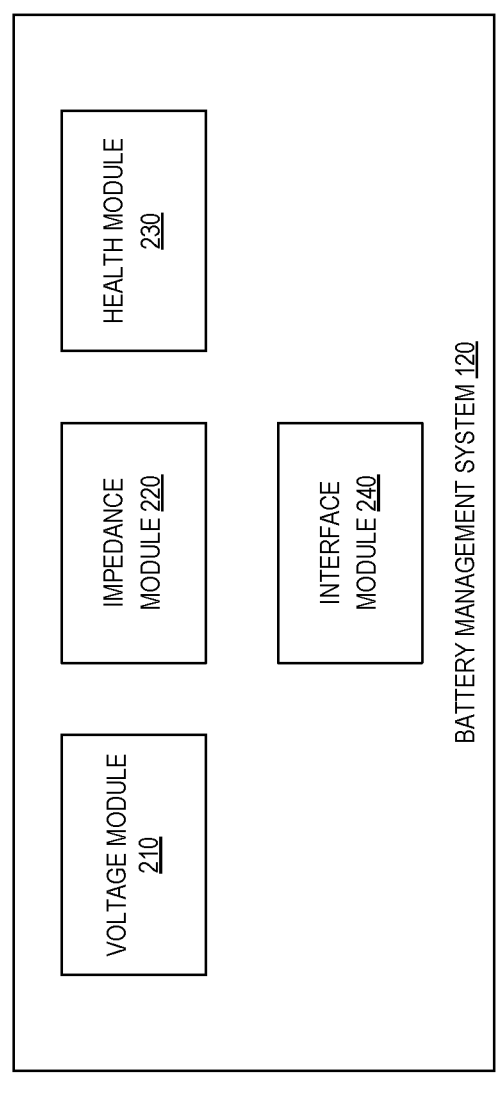
FIG. 2 is a diagram illustrating an example battery management system, in accordance with one or more embodiments of the present disclosure.

FIG. 2 is a block diagram that illustrates an example battery management system 120, in accordance with one or more embodiments of the present disclosure. The battery management system 120 includes a voltage module 210, an impedance module 220, a health module 230, and an interface module 240. Some or all of the modules, components, systems, engines, etc., illustrated in FIG. 2 may be implemented in software, hardware, firmware, or a combination thereof. The battery management system 120 may be part of a vehicle (e.g., vehicle 100 illustrated in FIG. 1).

In one embodiment, the voltage module 210 may determine an open circuit voltage of a battery of a vehicle (e.g., an open circuit voltage of power source 110 illustrated in FIG. 1). The open circuit voltage of the battery may be the difference in electrical potential between two terminals of the battery (e.g., a positive terminal and a negative terminal), when the battery is not connected to another circuit (e.g., is not connected to a load). For example, the open circuit voltage of the battery may be the difference in electrical potential between two terminals of the battery when the battery is not connected to a propulsion system (e.g., propulsion system 150 illustrated in FIG. 1).

In one embodiment, the voltage module 210 may determine the open circuit voltage of the battery by measuring the open circuit voltage at one or more terminals of the battery. The voltage module 210 may disconnect the power source (e.g., a battery) from a load and/or may cause the power source to be disconnected from the load. For example, the voltage module 210 may actuate a switch to disconnect the power source from the load or may cause the switch to be to disconnect the power source from the load (e.g., may transmit a request or an instruction to another component that may disconnect the power source from the load). After the power source is disconnected from the load, the voltage module 210 may use one or more sensors/devices (e.g., voltage meters, voltage detectors, etc., coupled to one or more terminal of the battery) to measure the open circuit of the battery.

In one embodiment, the voltage module 210 may access (e.g., retrieve, read, etc.) a previously determined open circuit voltage of the power source. The open circuit voltage of the power source (e.g., the battery) may have been measured at a previous time. For example, the open circuit voltage of the power source may have been measured when the power source was manufactured (e.g., constructed), when the power source was installed in the vehicle (or other apparatus/device), etc. The previously measured/determined open circuit voltage may be stored in a memory that may be accessed/read by the voltage module 210.

In one embodiment, the voltage module 210 may adjust the open circuit voltage based on one or more of an amount of time the power source has been in operation, a number of times the power source has been charged, and charging and discharging cycles of the battery. As discussed above, the open circuit voltage may have been previously measured/determined (e.g., measured when the power source was installed in the vehicle). As the power source (e.g., the battery) is used (e.g., charged and discharged), the open circuit voltage may change (e.g., may increase/decrease) due to the use. The voltage module 210 may adjust a previously determined/measured open circuit voltage to account for the use of the battery.

In one embodiment, the voltage module 210 may also determine the voltage of a current that is provided to the power source. For example, the power source (e.g., the battery) may be charged by the current that is provided to the power source (e.g., provided to the power source via a connector and/or wiring in the vehicle 100). The voltage module 210 may use one or more sensors/devices (e.g., voltage meters/detectors) to measure the voltage of the current as the power source is charged by the current. The current that is provided to the power source may be represented using the following equation:

$$I = V/R \tag{1}$$

where I is the current, V is the voltage component of the current (e.g., voltage of the current), and R is the resistance component of the current (e.g., resistance). As described herein, the voltage of the current may refer to the voltage component of the current (e.g., V in equation (1)).

In one embodiment, the impedance module 220 may determine an impedance indicator for the power source (e.g., a battery). The impedance module 220 may determine the impedance indicator for the power source based on the current provided to the power source, the voltage of the current provided to the power source (e.g., the voltage of the current used to charge the power source), and the open circuit voltage. For example, the impedance module may determine the impedance indicator based on the following equation:

$$R_{ch} = \frac{V - V_{OCV}}{I} \tag{2}$$

where $R_{ch}$ is the impedance indicator, I is the current provided to the power source, $V_{ocv}$ is the open circuit voltage, V is the voltage of the current I. The impedance indicator may also be referred to as a pseudo-resistance.

In one embodiment, the impedance indicator may represent one or more of the resistance of the power source (e.g., a battery) and the impedance of the power source. For example, the impedance indicator may represent the internal resistance of a power source at a state of charge. The internal resistance of the power source may be the opposition to the flow of current within the power source. For example, the internal resistance may affect the voltage and/or current when the power source is charged/discharged. In another example, the impedance indicator may represent the impedance of the power source, such as a battery. The impedance of the battery may be a combination of the resistance, inductance, and/or capacitance of the battery.

In one embodiment, the health module 230 may determine a health of the power source (e.g., a battery), based on the impedance indicator (e.g., based on the pseudo-resistance, based on $R_{ch}$, etc.). If the impedance indicator for a state of charge has changed (when compared to a previous impedance indicator for the same state of charge), this may indicate that the health of the battery has changed. For example, if the impedance indicator has increased, this may indicate that the health of the battery has decreased.

In one embodiment, the health of the power source may be determined based on various functions, formulas, correlations, etc., between the impedance indicator and the health of the battery. For example, a ten percent increase in the impedance indicator may correlate to a five percent decrease in battery health. The correlation between the impedance indicator and the health of the battery may be represented using various functions, formulas, etc. For example, the correlation between the impedance indicator may be represented using one or more of a linear function, multiple piecewise linear functions, an exponential function, a polynomial function, a quadratic function, a logarithmic function, etc.

In one embodiment, the functions, formulas, correlations, etc., between the impedance indicator and the health of the battery may be determined based on experimentation and/or testing with different types of power sources (e.g., different battery packs with different chemistries). For example, a previous battery (e.g., battery pack) may have been charged and discharged, and impedance indicators may have been calculated/determined for the previous battery. The impedance indicators (for different states of charge) at different ages of the previous battery may be recorded in table, list, or some other appropriate data structure. The impedance indicators for the previous battery may be referred to as reference impedance indicators. The health module 230 may use the reference impedance indicators to determine the health of the power source based on the impedance indicators obtained while the power source is charging. Different sets of reference impedance indicators may be determined for different types of battery packs. For example, a set of reference impedance indicators may be determined for each configuration/combination of cells, battery chemistries, capacities, etc., for a battery pack.

In one embodiment, the health module 230 may provide an indication of the health of the power source to an interface system (e.g., interface system 170 illustrated in FIG. 1). As discussed above, the interface system may provide information/data to a user (e.g., via one or more screens, displays, touch screens, etc.). The interface system may also receive user input (e.g., via buttons, touchscreens, etc.) that may allow the user to control the operation of the vehicle.

In one embodiment, the health module 230 may request adjustments to the current provided to the power source, based on one or more of the health of the power source and the impedance indicator. For example, the health module 230 may determine that the health of the battery has degraded by a certain amount (e.g., by a percentage) based on the impedance indicator. In another example, the health module 230 may determine that the impedance indicator of the power source has increased (e.g., the pseudo-resistance has increased). Based on the decrease in health of the battery (e.g., the increase in the impedance of the battery), the health module 230 may request that the voltage of the current provided to the battery be increased, to maintain a particular charging rate. In another example, the health module 230 may decrease the voltage of the current to preserve the health of the battery, if the health of the battery has decreased below a threshold health.

Figure 3:
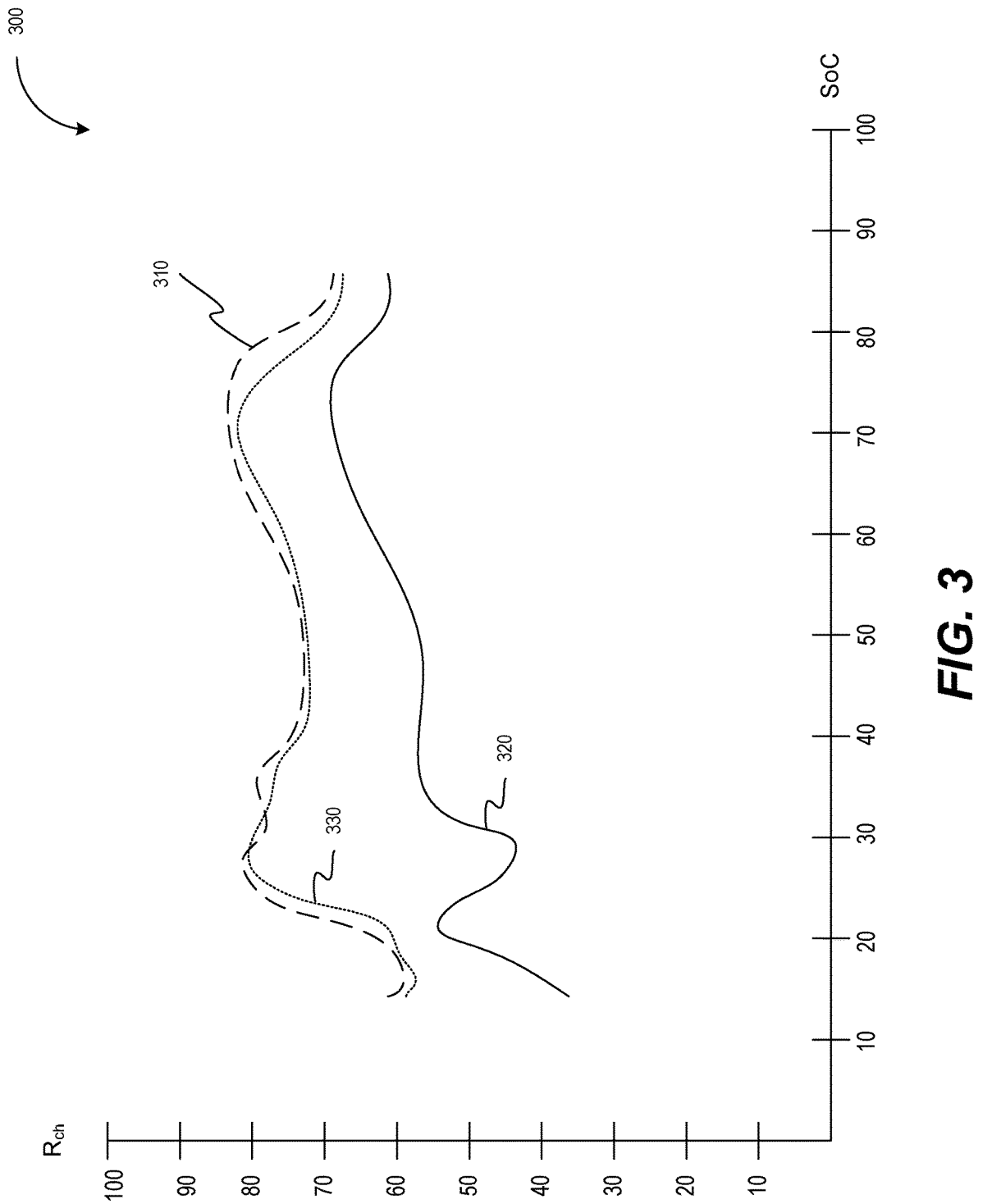
FIG. 3 is a graph illustrating example impedance indicator values, in accordance with one or more embodiments of the present disclosure.

FIG. 3 is a graph 300 illustrating example impedance indicator values, in accordance with one or more embodiments of the present disclosure. The X-axis of the graph 300 may indicate different states of charge (SoC) of a power source, such as a battery. The Y-axis of the graph 300 may indicate the different impedance indicators (e.g., different values for the impedance indicator). For example, the Y-axis of the graph may indicate impedances in terms of ohms, milliohms, etc. In another example, the Y-axis of the graph may a scaled value for impedance indicators, where 100 may represent a maximum impedance indicator and 0 may represent a minimum impedance indicator. As discussed above, a impedance indicator may represent an impedance of a battery, a resistance of battery, etc.

The graph 300 also includes line 310, line 320, and line 330. Lines 310, 320, and 330 represent the values of impedance indicators at different states of charge for the power source. In particular, line 320 indicates the values of impedance indicators at different states of charge when the power source is new or newer (e.g., when the power source was manufactured or installed in a vehicle). Line 310 indicates the values of impedance indicators at different states of charge when the power source is old or older (e.g., after the battery has been charged and discharged multiple times). As illustrated in FIG. 3, the line 310 is higher than the line 320, which indicates that the resistance and/or impedance of the battery has increased. An increase in the resistance and/or impedance of the battery may indicate or correlate to a decrease in the health of the battery.

Line 330 may be a reference line that indicates the values of impedance indicators at different states of charge for a previously tested/measured battery at a particular age. A battery management system may determine that line 310 (which may have been determined while the battery was charging) is within a threshold distance of line 330. The battery management system may determine that the age of the battery is close to the particular age for the previous battery, based on the lines 330 and 310.

Figure 4:
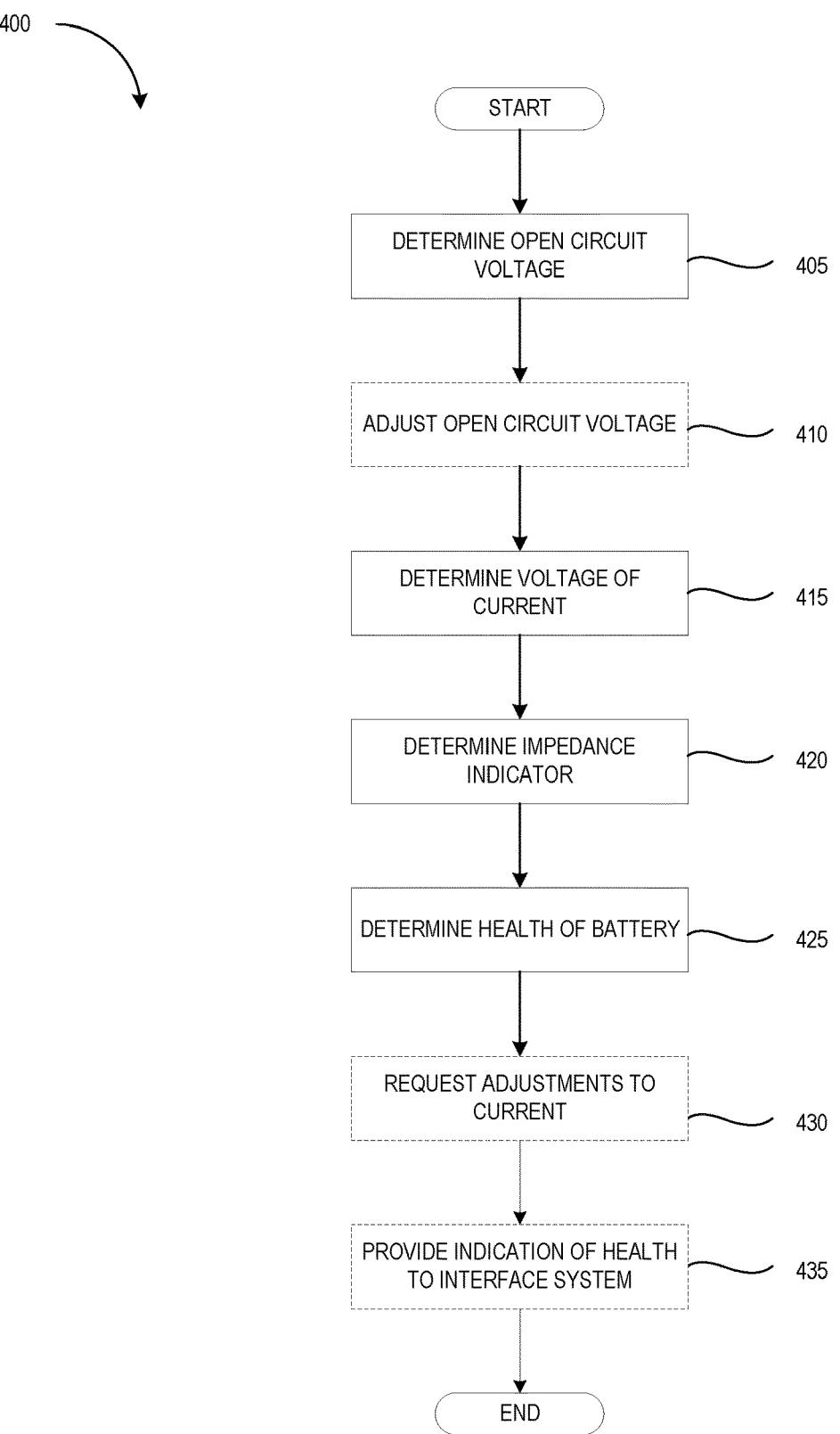
FIG. 4 is a flow diagram of a method for determining a health of a power source, in accordance with one or more embodiments of the present disclosure.

FIG. 4 is a flow diagram of a method 400 for determining a health of a power source (e.g., a battery), in accordance with one or more embodiments of the present disclosure. Process 400 may be performed by processing logic that may comprise hardware (e.g., circuitry, dedicated logic, programmable logic, a field programmable gate array (FPGA), an application specific integrated circuit (ASIC), a processor, a processing device, a central processing unit (CPU), a system-on-chip (SoC), etc.), software (e.g., instructions running/executing on a processing device), firmware (e.g., microcode), or a combination thereof. In some embodiments, the process 400 may be performed by a computing device (e.g., a server computer, a desktop computer, etc.), a battery management system (e.g., battery management system 120 illustrated in FIGS. 1-2), and/or various components, modules, engines, systems, etc., of the battery management system (as illustrated in FIG. 2).

With reference to FIG. 4, method 400 illustrates example functions used by various embodiments. Although specific function blocks ("blocks") are disclosed in method 400, such blocks are examples. That is, embodiments are well suited to performing various other blocks or variations of the blocks recited in method 400. It is appreciated that the blocks in method 400 may be performed in an order different than presented, and that not all of the blocks in method 400 may be performed, and other blocks (which may not be included in FIG. 4) may be performed between the blocks illustrated in FIG. 4.

The method 400 begins at block 405 where the method 400 determines an open circuit voltage of a power source, such as a battery. For example, the method 400 may measure the open circuit voltage at one or more terminals of the battery or may retrieve/access a previously measured/determined open circuit voltage for the battery. At block 410, the method 400 may optionally adjust the open circuit voltage. For example, the method 400 may increase the open circuit voltage, based on the number of times the battery has been charged, based on the number of times the battery has been charged, etc.

A block 415, the method 400 may determine a voltage of a current that is provided to the battery. For example, the method 400 may measure the voltage of the current that is provided to the battery. At block 420, the method 400 may determine a impedance indicator based on the voltage of the current, the open circuit voltage, and the current. For example, the method 400 may determine the difference between the open current voltage and the voltage of the current and may divide the difference by the current. As discussed above, the impedance indicator may represent an impedance of a battery, a resistance of a battery, etc. At block 425, the method 400 may determine a health (e.g., a state of health) of the battery. For example, the method 400 may determine that the impedance indicator at a state of charge has increased by an amount when compared to a reference impedance indicator (at the same state of charge). The method 400 may use one or more of a linear function, a quadratic function, an exponential function, a logarithmic function, and a polynomial function, to determine the health of the battery based on the impedance indicator. Based on this increase, the method 400 may determine that the health of the battery has decreased by a certain amount, a certain percentage, etc.

At block, 430, the method 400 may optionally request adjustments to the current that is provided to the battery. For example, the method 400 may request an increase or decrease to the voltage of the current that is provided to the battery. At block 435, the method 400 may optionally provide an indication of the health of the battery, to an interface system. For example, the method 400 may provide a value, number, etc., indicating the health of the battery to the interface system, and the interface system may display that information to a user.

Figure 5:
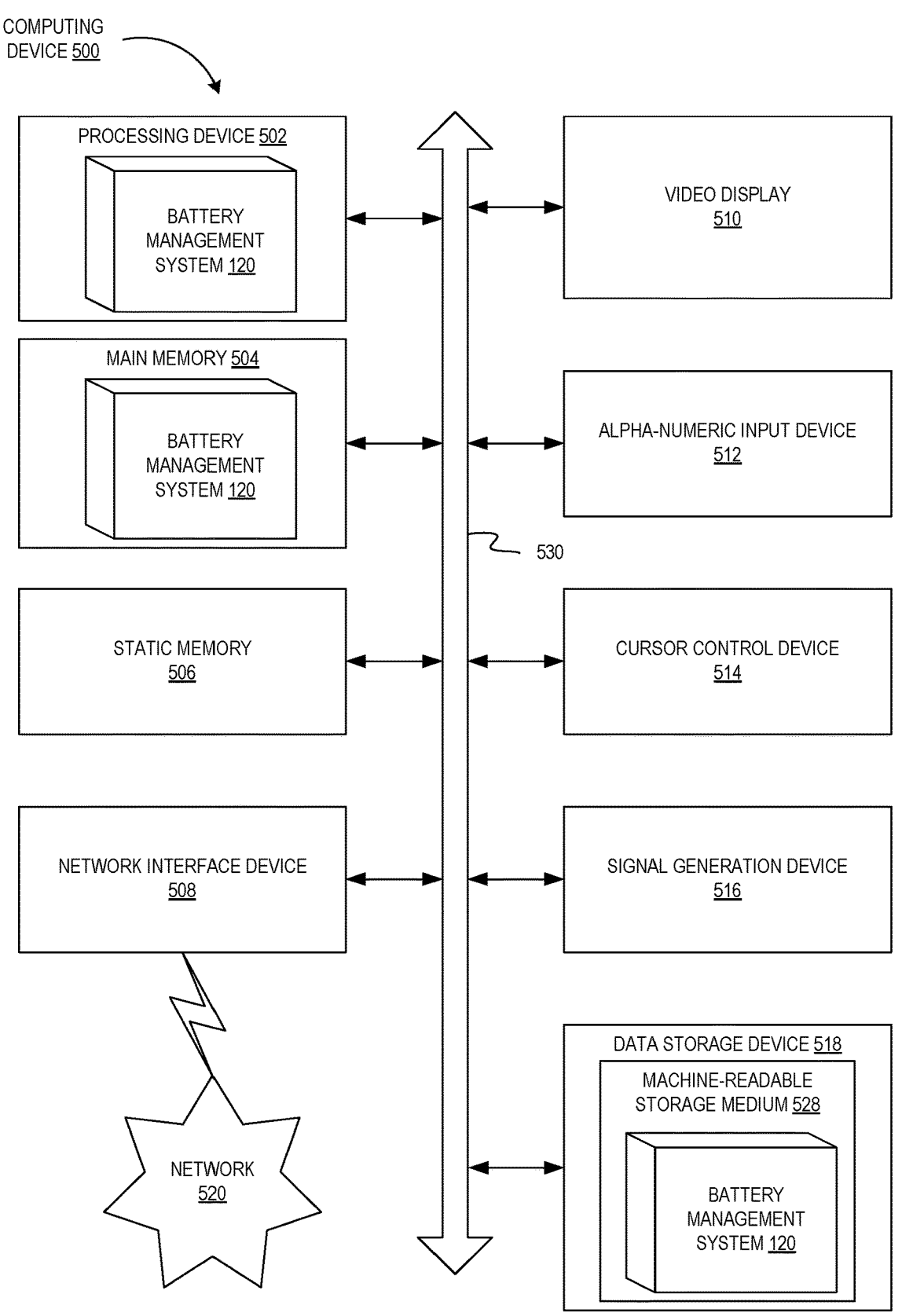
FIG. 5 is a block diagram of an example computing device that may perform one or more of the operations described herein, in accordance with some embodiments of the present disclosure.

FIG. 5 is a block diagram of an example computing device 500 that may perform one or more of the operations described herein, in accordance with some embodiments. Computing device 500 may be connected to other computing devices in a LAN, an intranet, an extranet, and/or the Internet. The computing device may operate in the capacity of a server machine in client-server network environment or in the capacity of a client in a peer-to-peer network environment. The computing device may be provided by a personal computer (PC), a set-top box (STB), a server, a network router, switch or bridge, or any machine capable of executing a set of instructions (sequential or otherwise) that specify actions to be taken by that machine. Further, while only a single computing device is illustrated, the term "computing device" shall also be taken to include any collection of computing devices that individually or jointly execute a set (or multiple sets) of instructions to perform the methods discussed herein.

The example computing device 500 may include a processing device (e.g., a general purpose processor, a PLD, etc.) 502, a main memory 504 (e.g., synchronous dynamic random access memory (DRAM), read-only memory (ROM)), a static memory 506 (e.g., flash memory and a data storage device 518), which may communicate with each other via a bus 530.

Processing device 502 may be provided by one or more general-purpose processing devices such as a microprocessor, central processing unit, or the like. In an illustrative example, processing device 502 may comprise a complex instruction set computing (CISC) microprocessor, reduced instruction set computing (RISC) microprocessor, very long instruction word (VLIW) microprocessor, or a processor implementing other instruction sets or processors implementing a combination of instruction sets. Processing device 502 may also comprise one or more special-purpose processing devices such as an application specific integrated circuit (ASIC), a field programmable gate array (FPGA), a digital signal processor (DSP), network processor, or the like. The processing device 502 may be configured to execute the operations described herein, in accordance with one or more aspects of the present disclosure, for performing the operations and steps discussed herein.

Computing device 500 may further include a network interface device 508 which may communicate with a network 520. The computing device 500 also may include a video display unit 510 (e.g., a liquid crystal display (LCD) or a cathode ray tube (CRT)), an alphanumeric input device 512 (e.g., a keyboard), a cursor control device 514 (e.g., a mouse) and an acoustic signal generation device 516 (e.g., a speaker). In one embodiment, video display unit 510, alphanumeric input device 512, and cursor control device 514 may be combined into a single component or device (e.g., an LCD touch screen).

Data storage device 518 may include a computer-readable storage medium 528 on which may be stored one or more sets of instructions, e.g., instructions for carrying out the operations described herein, in accordance with one or more aspects of the present disclosure. Instructions implementing the different systems described herein (e.g., battery management system 120 and/or various components, modules, engines, systems, etc., of a battery management system (as illustrated in FIGS. 1-2) may also reside, completely or at least partially, within main memory 504 and/or within processing device 502 during execution thereof by computing device 500, main memory 504 and processing device 502 also constituting computer-readable media. The instructions may further be transmitted or received over a network 520 via network interface device 508.

While computer-readable storage medium 528 is shown in an illustrative example to be a single medium, the term "computer-readable storage medium" should be taken to include a single medium or multiple media (e.g., a centralized or distributed database and/or associated caches and servers) that store the one or more sets of instructions. The term "computer-readable storage medium" shall also be taken to include any medium that is capable of storing, encoding or carrying a set of instructions for execution by the machine and that cause the machine to perform the methods described herein. The term "computer-readable storage medium" shall accordingly be taken to include, but not be limited to, solid-state memories, optical media and magnetic media.

Unless specifically stated otherwise, terms such as "generating," "determining," "measuring," "adjusting," "dividing," "requesting," "providing," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

Examples described herein also relate to an apparatus for performing the operations described herein. This apparatus may be specially constructed for the required purposes, or it may comprise a general purpose computing device selectively programmed by a computer program stored in the computing device. Such a computer program may be stored in a computer-readable non-transitory storage medium.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method, comprising:
determining, by a battery management system included within a vehicle, an open circuit voltage of a battery of the vehicle;
measuring, by the battery management system, a voltage of a current provided to the battery of the vehicle;
determining, by the battery management system, an impedance indicator based on the measured voltage, the open circuit voltage, and the current provided to the battery of the vehicle; and
determining, by the battery management system, a health of the battery based on the impedance indicator.

2. The method of claim 1, wherein the impedance indicator represents one or more of a resistance and an impedance of the battery at a state of charge.

3. The method of claim 1, wherein determining the voltage comprises: measuring, by a battery management system, the voltage of the current.

4. The method of claim 1, wherein the open circuit voltage is determined based on a previous measurement of the battery retrieved from stored historical measurement data of the battery.

5. The method of claim 1, further comprising: adjusting the open circuit voltage based on one or more of an amount of time the battery has been in operation, a number of times the battery has been charged, and charging and discharging cycles of the battery.

6. The method of claim 1, wherein determining the open circuit voltage comprises: measuring, by a battery management system, the open circuit voltage at one or more terminals of the battery.

7. The method of claim 1, wherein determining the impedance indicator comprises:

determining a difference between the measured voltage and the open circuit voltage; and dividing the difference by the current.

8. The method of claim 1, determining the health of the battery comprises:

determining whether the impedance indicator of the battery has increased;

in response to determining that the impedance indicator of the battery has increased, determining that the health of the battery has decreased.

9. The method of claim 1, further comprising: requesting adjustments to the current provided to the battery of the vehicle, based on the health of the battery.

10. The method of claim 1, further comprising: providing an indication of the health to an interface system.

11. An apparatus, comprising:

a memory configured to store data; and a processing device coupled to the memory, the processing device configured to:

determine, by a battery management system included within a vehicle, an open circuit voltage of a battery of the vehicle;

measure, by the battery management system, a voltage of a current provided to the battery of the vehicle;

determine, by the battery management system, an impedance indicator based on the measured voltage, the open circuit voltage, and the current provided to the battery of the vehicle; and determine, by the battery management system, a health of the battery based on the impedance indicator.

12. The apparatus of claim 11, wherein the impedance indicator represents one or more of a resistance and an impedance of the battery at a state of charge.

13. The apparatus of claim 11, wherein to determine the voltage the processing devices is further to:

measure, by the battery management system, the voltage of the current.

14. The apparatus of claim 11, wherein the open circuit voltage is determined based on a previous measurement of the battery retrieved from stored historical measurement data of the battery.

15. The apparatus of claim 11, wherein the processing devices is further to:

adjust the open circuit voltage based on one or more of an amount of time the battery has been in operation, a number of times the battery has been charged, and charging and discharging cycles of the battery.

16. The apparatus of claim 11, wherein to determine the open circuit voltage the processing devices is further to:

measure the open circuit voltage at one or more terminals of the battery.

17. The apparatus of claim 11, wherein to determine the impedance indicator the processing devices is further to:

determine a difference between the measured voltage and the open circuit voltage; and divide the difference by the current.

18. The apparatus of claim 11, to determine the health of the battery the processing devices is further to:

determine whether the impedance indicator of the battery has increased;

in response to determining that the impedance indicator of the battery has increased, determine that the health of the battery has decreased.

19. The apparatus of claim 11, wherein the processing devices is further to:

request adjustments to the current provided to the battery of the vehicle, based on the health of the battery.

20. A non-transitory computer-readable storage medium including instructions that, when executed by a processing device, cause the processing device to:

determine, by a battery management system included within a vehicle, an open circuit voltage of a battery of the vehicle;

measure, by the battery management system, a voltage of a current provided to the battery of the vehicle;

determine, by the battery management system, an impedance indicator based on the measured voltage, the open circuit voltage, and the current provided to the battery of the vehicle; and determine, by the battery management system, a health of the battery based on the impedance indicator.

* * * * *